United States Patent
Ding (10) Patent No.: US 6,838,342 B1
(45) Date of Patent: Jan. 4, 2005

(54) NONVOLATILE MEMORY FABRICATION METHODS COMPRISING LATERAL RECESSING OF DIELECTRIC SIDEWALLS AT SUBSTRATE ISOLATION REGIONS

(75) Inventor: Yi Ding, Sunnyvale, CA (US)

(73) Assignee: ProMOS Technologies, Inc., Hsin Chu (TW)

( * ) Notice: Subject to any disclaimer, the term of this patent is extended or adjusted under 35 U.S.C. 154(b) by 0 days.

(21) Appl. No.: 10/678,317

(22) Filed: Oct. 3, 2003

(51) Int. Cl.[7] .............................................. H01L 21/336
(52) U.S. Cl. ....................... 438/257; 438/211; 438/258; 438/266
(58) Field of Search .............................. 438/211, 257, 438/258, 259, 260, 261, 262, 263, 264, 265, 266, 267

(56) References Cited

U.S. PATENT DOCUMENTS

| | | | |
|---|---|---|---|
| 5,940,717 A | * 8/1999 | Rengarajan et al. | 438/435 |
| 6,127,215 A | * 10/2000 | Joachim et al. | 438/224 |
| 6,130,129 A | 10/2000 | Chen | |
| 6,200,856 B1 | 3/2001 | Chem | |
| 6,222,225 B1 | 4/2001 | Nakamura et al. | |
| 6,228,713 B1 | 5/2001 | Pradeep et al. | |
| 6,312,989 B1 | * 11/2001 | Hsieh et al. | 438/257 |
| 6,319,794 B1 | 11/2001 | Akatsu et al. | |
| 6,323,085 B1 | 11/2001 | Sandhu et al. | |
| 6,355,524 B1 | 3/2002 | Tuan et al. | |
| 6,376,877 B1 | 4/2002 | Yu et al. | |
| 6,417,047 B1 | 7/2002 | Isobe | |
| 6,448,606 B1 | 9/2002 | Yu et al. | |
| 6,518,618 B1 | 2/2003 | Fazio et al. | |
| 6,555,427 B1 | 4/2003 | Shimizu | |
| 6,570,215 B2 | * 5/2003 | Tuan et al. | 438/257 |
| 6,670,243 B2 | * 12/2003 | Saito | 438/264 |
| 6,743,675 B2 | * 6/2004 | Ding | 438/257 |

FOREIGN PATENT DOCUMENTS

JP  2000-174242  6/2000

OTHER PUBLICATIONS

Aritome, S. et al., "A 0.67um$^2$ Self–Aligned Shallow Trench Isolation Cell (SA–STI Cell) For 3V–only 256Mbit NAND EEPROMs," International Electron Devices meeting 1994, San Francisco, CA, Dec. 11–14, 1994, pp. 94–61—94–64.
Keeney, Stephen N., A 130nm Generation High Density Etox™ Flash Memory Technology, Intel, Corporation, Santa Clara, California, USA, 42 sheets.
U.S. Appl. No. 10/266,378 entitled "Floating Gate Memory Structures And Fabrication Methods," filed on Oct. 7, 2002, Inventor: Chia–Shun Hsiao, Attorney Docket No. M–12200 US.
U.S. Appl. No. 10/262,785, entitled "Floating Gate Memory Fabrication Methods Comprising A Field Dielectric Etch With A Horizontal Etch Component," filed on Oct. 1, 2002, Inventor: Yi Ding, Attorney Docket No.: M–12841 US.
Silicon, Flash and Other Non–Volatile Memory Technologies, http://www.intel.com/research/silicon/flash.htm, Sep. 12, 2002, pp. 1–4.
Patent Abstracts of Japan of JP 2000–174242.

* cited by examiner

Primary Examiner—Kevin M. Picardat
(74) Attorney, Agent, or Firm—MacPherson Kwok Chen & Heid LLP; Michael Shenker (57) ABSTRACT

A floating gate of a nonvolatile memory cell is formed from two conductive layers (410.1, 410.2). A dielectric (210) in substrate isolation regions and the first of the two conductive layers providing the floating gates (410.1) are formed so that the dielectric has an exposed sidewall. At least the top portion of the sidewall is exposed. Then some of the dielectric is removed from the exposed portions of the dielectric sidewalls to laterally recess the sidewalls. Then the second conductive layer (410.2) for the floating gates is formed. The recessed sidewalls of the dielectric allow the second conductive layer to expand laterally, thus increasing the capacitive coupling between the floating and control gates and improving the gate coupling ratio.

13 Claims, 8 Drawing Sheets

NONVOLATILE MEMORY FABRICATION METHODS COMPRISING LATERAL RECESSING OF DIELECTRIC SIDEWALLS AT SUBSTRATE ISOLATION REGIONS

BACKGROUND OF THE INVENTION

The present invention relates to floating gate nonvolatile memories.

A floating gate nonvolatile memory cell stores information by storing an electrical charge on its floating gate. The floating gate is capacitively coupled to the control gate. In order to write the cell, a potential difference is created between the control gate and some other region, for example, the source, drain or channel region of the cell. The voltage on the control gate is capacitively coupled to the floating gate, so a potential difference appears between the floating gate and the source, drain or channel region. This potential difference is used to change the charge on the floating gate.

Figure 1:
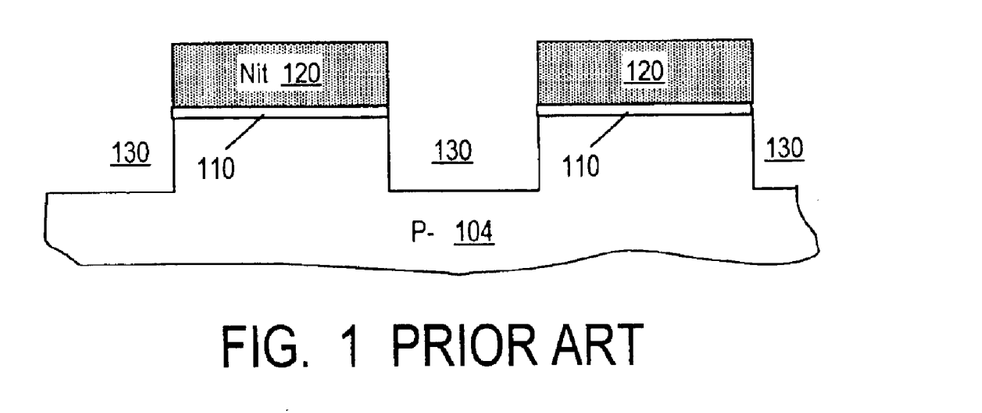
FIGS. 1–7 show cross sections of prior art semiconductor memory structures in the process of fabrication.
Figure 2:
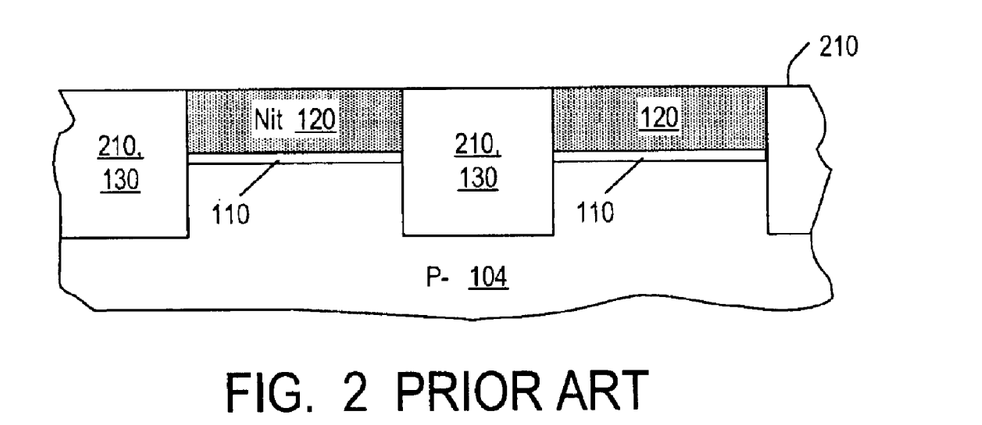
Figure 3:
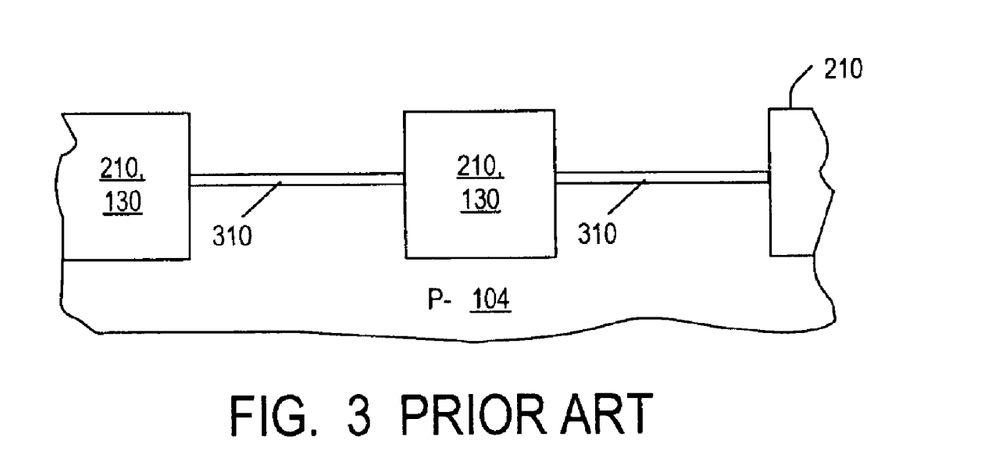
Figure 4:
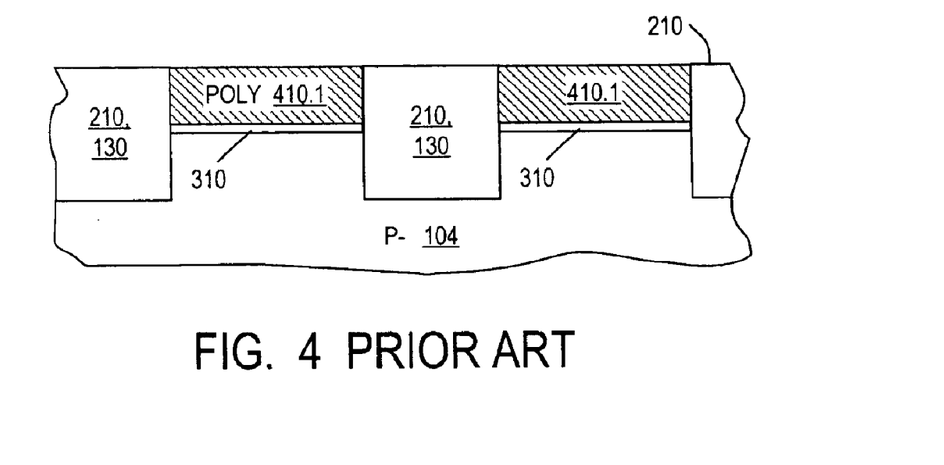

In order to reduce the potential difference that has to be provided between the control gate and the source, drain or channel region, it is desirable to increase the capacitance between the control and floating gates relative to the capacitance between the floating gate and the source, drain or channel region. More particularly, it is desirable to increase the "gate coupling ratio" GCR defined as CCG/(CCG+CSDC) where CCG is the capacitance between the control and floating gates and CSDC is the capacitance between the floating gate and the source, drain or channel region. One method for increasing this ratio is to form spacers on the floating gate. See U.S. Pat. No. 6,200,856 issued Mar. 13, 2001 to Chen, entitled "Method of Fabricating Self-Aligned Stacked Gate Flash Memory Cell", incorporated herein by reference. In that patent, the memory is fabricated as follows. Silicon substrate 104 (FIG. 1) is oxidized to form a pad oxide layer 110. Silicon nitride 120 is formed on oxide 110 and patterned to define isolation trenches 130. Oxide 10 and substrate 104 are etched, and the trenches are formed. Dielectric 210 (FIG. 2), for example, borophosphosilicate glass, is deposited over the structure to fill the trenches, and is planarized by chemical mechanical polishing (CMP). The top surface of dielectric 210 becomes even with the top surface of nitride 120. Then nitride 120 is removed (FIG. 3). Oxide 110 is also removed, and gate oxide 310 is thermally grown on substrate 104 between the isolation trenches. Doped polysilicon layer 410.1 (FIG. 4) is deposited over the structure to fill the recessed areas between the isolation regions 210. Layer 410.1 is polished by chemical mechanical polishing so that the top surface of layer 410.1 becomes even with the top surface of dielectric 210.

Figure 5:
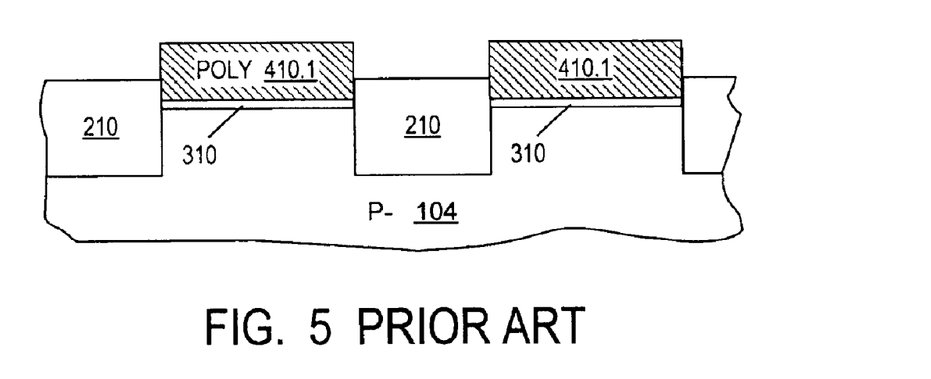
Figure 6:
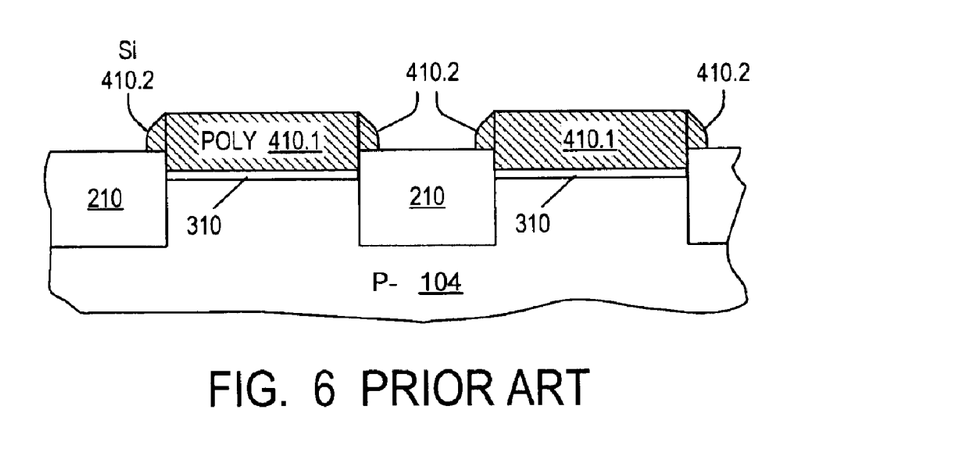

Dielectric 210 is etched to partially expose the "edges" of polysilicon layer 410.1 (FIG. 5). Then doped polysilicon 410.2 (FIG. 6) is deposited and etched anisotropically to form spacers on the edges of polysilicon 410.1. Layers 410.1, 410.2 provide the floating gates.

Figure 7:
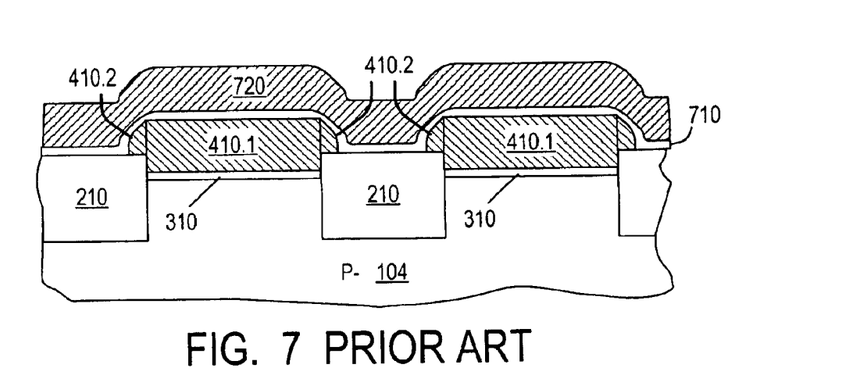

As shown in FIG. 7, dielectric 710 (oxide/nitride/oxide) is formed on polysilicon 410.1, 410.2. Doped polysilicon layer 720 is deposited on dielectric 710 and patterned to provide the control gates.

Spacers 410.2 increase the capacitance between the floating and control gates by more than the capacitance between the floating gates and substrate 104, so the gate coupling ratio is increased.

SUMMARY

This section summarizes some features of the invention. Other features are described in the subsequent sections. The invention is defined by the appended claims which are incorporated into this section by reference.

In some embodiments of the present invention, as in prior art, the floating gate is formed from two conductive layers, but the fabrication process is different. In one embodiment, the dielectric in the substrate isolation regions (such as dielectric 210) and the first of the two conductive layers providing the floating gates (such as layer 410.1) are formed so that the dielectric has an exposed sidewall. At least the top portion of the sidewall is exposed. This can be achieved by etching down the first conductive layer to lower it top surface below the top surface of the dielectric regions. Then some of the dielectric is removed from the exposed portions of the dielectric sidewalls to laterally recess the sidewalls. Then the second conductive layer for the floating gates is formed. The recessed sidewalls of the dielectric allow the second conductive layer to expand laterally, thus increasing the capacitive coupling between the floating and control gates and improving the gate coupling ratio.

The invention is not limited to the features described above. For example, the floating gates can be formed from more than two layers. Other features and advantages of the invention are described below. The invention is defined by the appended claims.

DESCRIPTION OF SOME EMBODIMENTS

The embodiments described in this section illustrate but do not limit the invention. The invention is not limited to particular materials, process steps, conductivity types (P or N), or dimensions. The invention is defined by the appended claims.

Figure 8:
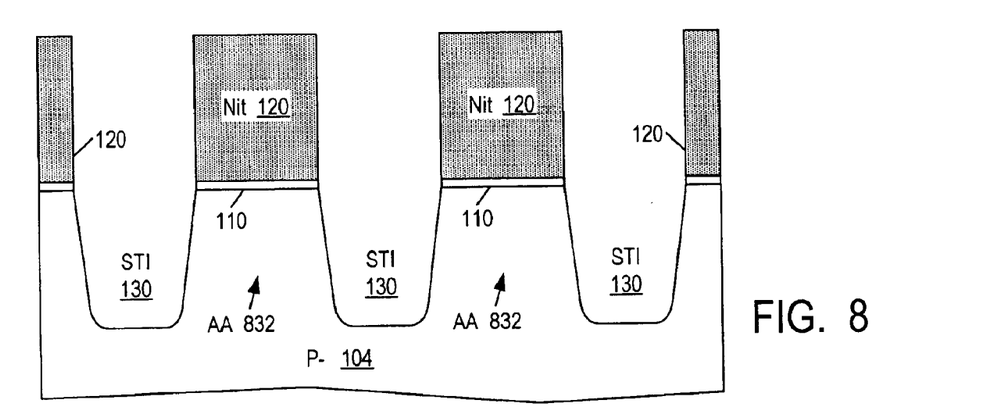
FIGS. 8–20 show vertical cross sections of memory structures during fabrication according to embodiments of the present invention.

The beginning stages of the memory fabrication can be as in FIGS. 1–4. In some embodiments, the memory array is fabricated in a doped region of type P—that is formed in monocrystalline semiconductor substrate 104 (FIG. 8). This region can be isolated by P-N junctions (not shown). See e.g. U.S. Pat. No. 6,355,524 issued Mar. 12, 2002 to H. T. Tuan et al. and incorporated herein by reference.

Silicon dioxide 110 (pad oxide) is formed on substrate 104 by thermal oxidation or some other technique to an exemplary thickness of 150 Å. (The dimensions are given for an exemplary process using a 0.18 $\mu$m line width technology; the line width is the minimal dimension that can be reliably printed photolithographically). Silicon nitride 120 is deposited on oxide 110. In one embodiment, the thickness of nitride 120 is in the range of 2000 Å to 2200 Å. Nitride 120 is patterned photolithographically, using a photoresist mask (not shown), to define substrate isolation trenches 130. Oxide 110 and substrate 104 are etched through the openings in nitride 120. Trenches 130 ("STI trenches") are formed in the substrate as a result. An exemplary depth of trenches 130 is 0.2 $\mu$m, measured from the top surface of the substrate 104. Other depths are possible. Trenches 130 will be filled with dielectric to provide isolation between active areas 832 of substrate 104.

In FIG. 8, the trenches have sloping sidewalls, and the trenches widen at the top. In some embodiments, the trenches have vertical sidewalls, or the trenches are wider at the bottom. The invention is not limited by the shape of the trenches.

Figure 9:
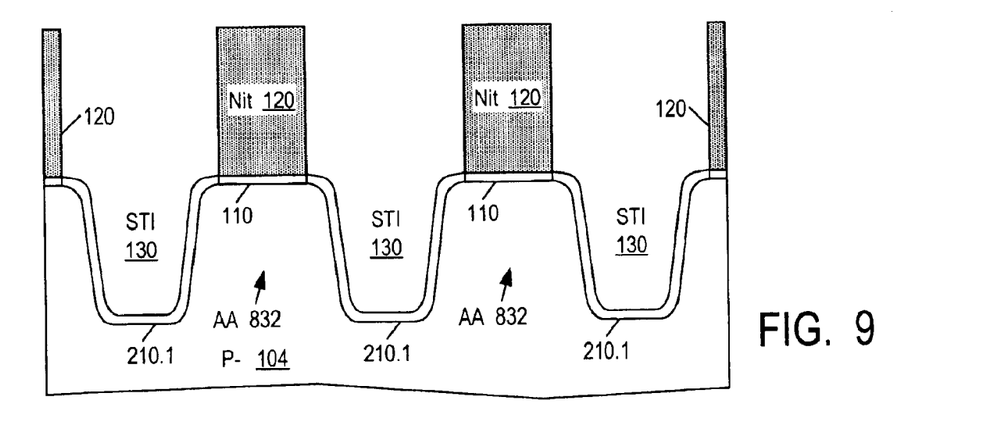

Nitride 120 is subjected to a wet etch to recess the vertical edges of the nitride layer away from trenches 130. See FIG. 9. This step reduces the aspect ratio of the holes that will be filled with dielectric 210 (these holes are formed by the openings in nitride 120 and oxide 110 and by the trenches 130). The lower aspect ratio facilitates filling these holes. As will be seen below, the etch of nitride 120 will also reduce the capacitance between the floating gate and the substrate 104, thus increasing the gate coupling ratio.

Figure 10:
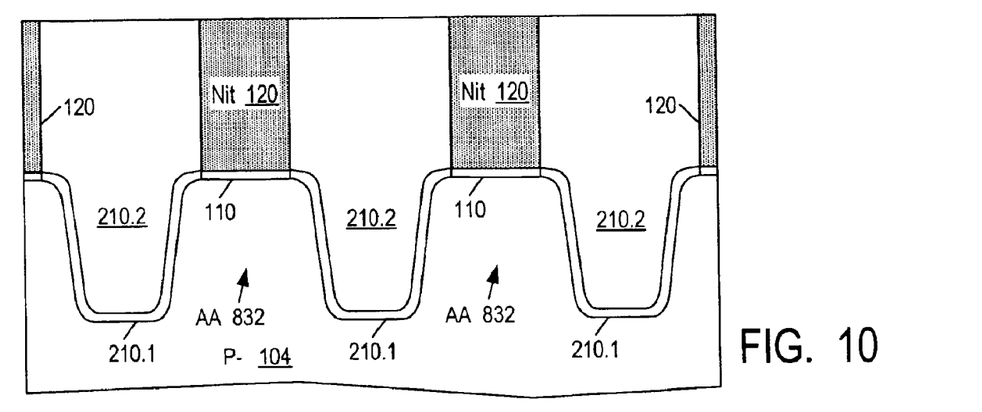

A thin layer 210.1 of silicon dioxide is thermally grown on the exposed silicon surfaces to round the edges of trenches 130 and passivate the trench surfaces. Silicon dioxide 210.2 (FIG. 10) is deposited by a high density plasma process. Oxide 210.2 fills the trenches and initially covers the nitride 120. Oxide 210.2 is polished by a CMP process that stops on nitride 120. A planar top surface is provided.

In the subsequent figures, the layers 210.1, 210.2 are shown as a single layer 210. This dielectric 210 will be referred to as STI dielectric or, more generally, as field dielectric.

Nitride 120 is removed selectively to oxide 210. This can be done by a wet etch (e.g. with phosphoric acid). Pad oxide 110 is etched away to expose the substrate 104 in the active areas. The oxide etch may remove a small amount of oxide 210.

Gate dielectric 310 (FIG. 11) is formed on the active areas. In one example, dielectric 310 is silicon dioxide thermally grown to a thickness of 90 Å.

Figure 11:
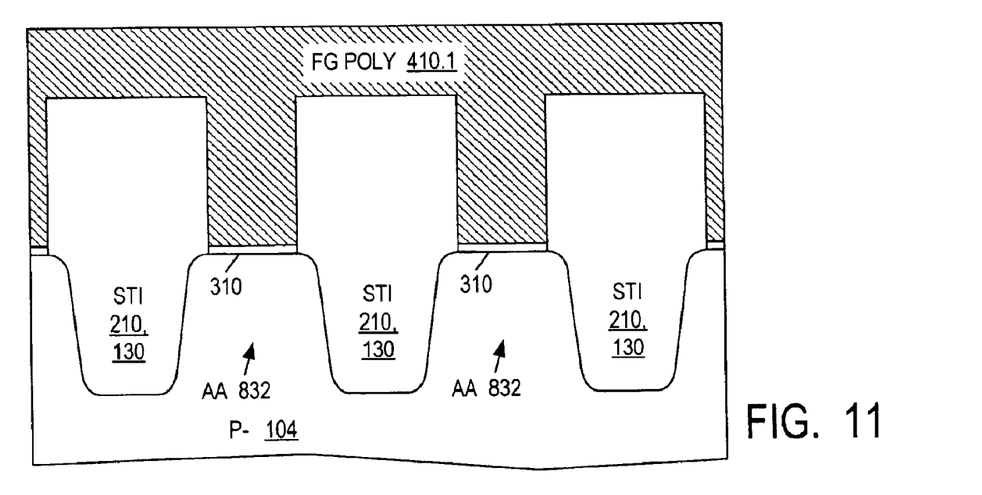

Polysilicon 410.1 is deposited over the wafer and is heavily doped during or after the deposition. Layer 410.1 will provide portions of the conductive floating gates. An exemplary deposition process is LPCVD. Polysilicon 410.1 fills the recesses between the STI dielectric regions 210 and covers the whole wafer.

Polysilicon 410.1 is subjected to a timed etch to lower its top surface below the top surface of dielectric 210. See FIG. 12. If the polysilicon surface is not initially planar, the polysilicon can be planarized by depositing an auxiliary layer (e.g. photoresist) having a planar top surface and adjusting the etch to obtain equal etch rates for the polysilicon and the auxiliary layer. Other planarization methods are also possible (e.g. CMP).

Figure 12:
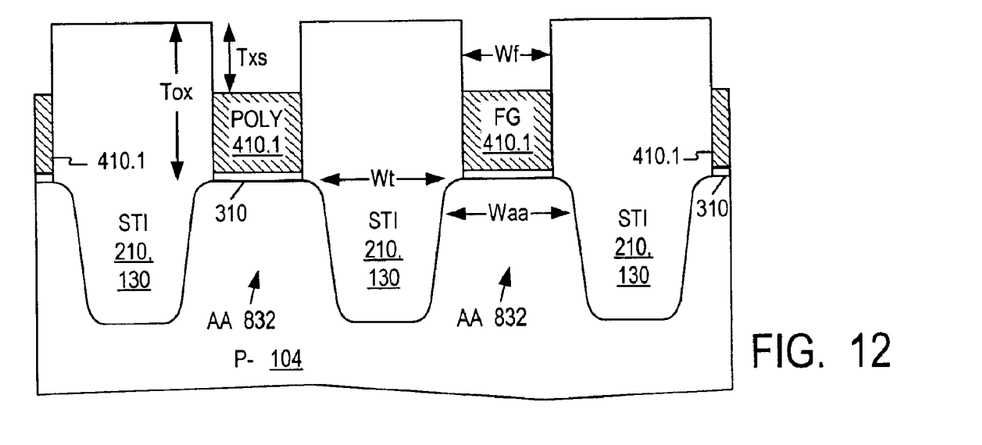

In one example, the dimensions are as follows. The width Wt of each trench 130 is 0.18 $\mu$m at the top of the trench. The width Waa of each active area 832 is also 0.18 $\mu$m. The width Wf of each floating gate feature 410.1 is 0.16 $\mu$m (Wf is the distance between the adjacent regions 210 above the substrate 104). STI oxide 210 protrudes by an amount Tox above the top surface of substrate 104. Tox is between 1900 Å and 2100 Å. Polysilicon layer 410.1 is 900 Å thick. Oxide 310 is 90 Å thick. Therefore, the height Txs of the exposed portions of the sidewalls of oxide 210 is between 910 Å and 1110 Å.

Figure 13:
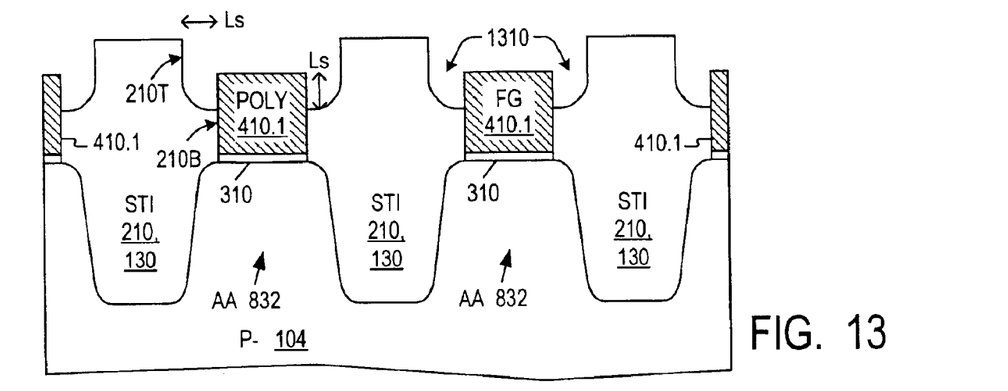

Oxide 210 is etched selectively to polysilicon 410.1 (FIG. 13). The etch includes a horizontal component that causes the sidewalls of oxide 210 to be laterally recessed in the direction away from the adjacent polysilicon features 410.1 and active areas 832. This can be an isotropic wet etch. In some embodiments, the top sidewall portions 210T of oxide 210 become positioned over trenches 130, while the bottom sidewall portions 210B continue to overlap the active areas. In one embodiment, the isotropic etch laterally recesses the sidewall by an amount Ls in the range of 0.06 $\mu$m to 0.07 $\mu$m. The etch also lowers the top surface of oxide 210 by the same amount. In addition, the etch attacks the oxide portions near the polysilicon 410.1 to form pockets 1310 in which the top surface of oxide 210 falls below the top surface of polysilicon 410.1. The sidewalls of polysilicon 410.1 are exposed in these pockets. In some embodiments, the sidewalls are exposed to the depth Ls measured from the top surface of polysilicon 410.1. In FIG. 13, the top surface of oxide 210 is above the top surface of polysilicon 410.1 after the oxide etch, but this is not necessary. The top surface of oxide 210 may be even with, or below, the top surface of polysilicon 410.1.

Figure 14:
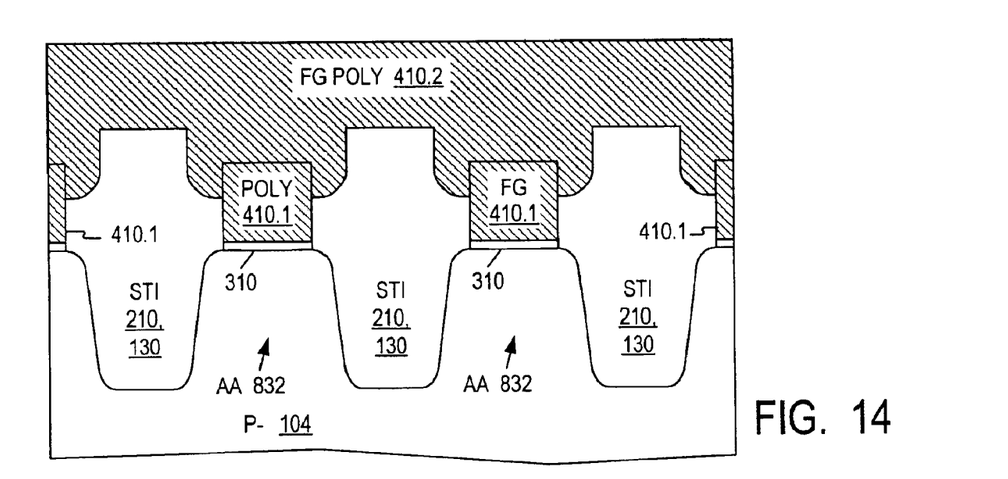

Polysilicon layer 410.2 (FIG. 14) is deposited on the structure, and is doped during or after the deposition to the same conductivity type as the layer 410.1. Layer 410.2 will provide portions of the floating gates. Layer 410.2 fills the pockets 1310. An exemplary deposition process is conformal low pressure chemical vapor deposition (LPCVD). The thickness of layer 410.2 (at least 2000 Å in some embodiments) is chosen to provide a planar top surface. The planar top surface is not necessary however.

Figure 15:
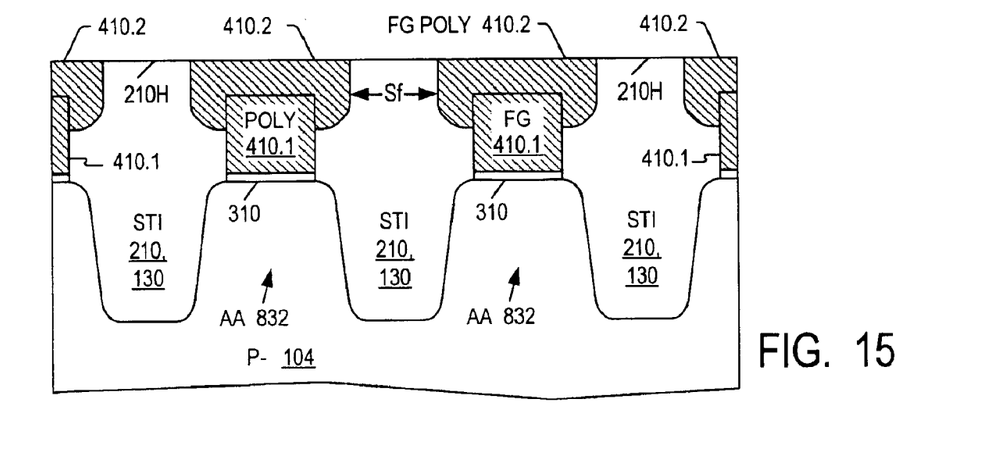

Layer 410.2 is subjected to CMP or an etch to remove the polysilicon 410.2 from over the top horizontal surfaces 210H (FIG. 15) of oxide features 210 and thus to isolate the floating gates from each other. Each floating gate will include the adjacent portions of layers 410.1, 410.2 that contact each other. In some embodiments, if the top surface of polysilicon 410.2 is not planar before the etch, a planarizing etch can be used with an auxiliary material (e.g. photoresist) as described above in connection with the etch of layer 410.1. The top surface of layer 410.2 may be above, below, or even with the horizontal top surface 210H of oxide 210.

The recessed sidewalls of oxide 210 allow the floating gates to extend laterally (by the amount Ls) beyond the floating gate portions 410.1 and, possibly, beyond the active areas 832. The lateral extension of the floating gates increases the capacitive coupling between the floating gates and the control gates 720 (FIG. 17) and increases the gate coupling ratio. In one embodiment, the spacing Sf between the adjacent floating gates is only 0.05–0.06 $\mu$m for the dimensions given above in connection with FIG. 13. Sf can be smaller than the minimum line width.

Figure 16:
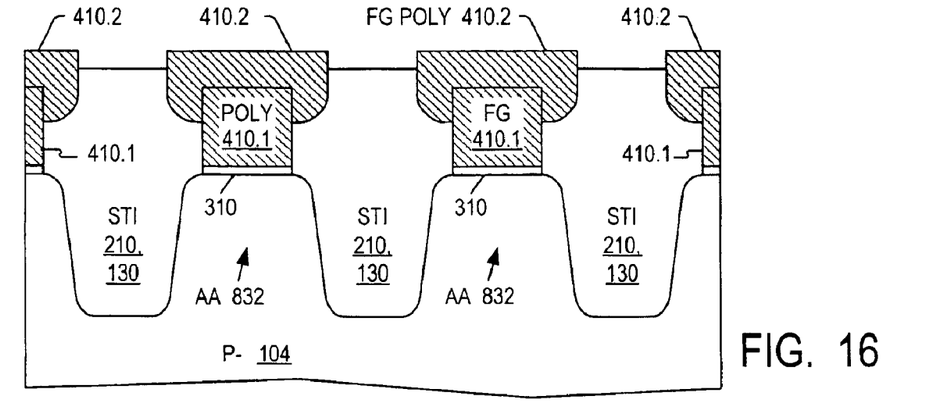
Figure 17:
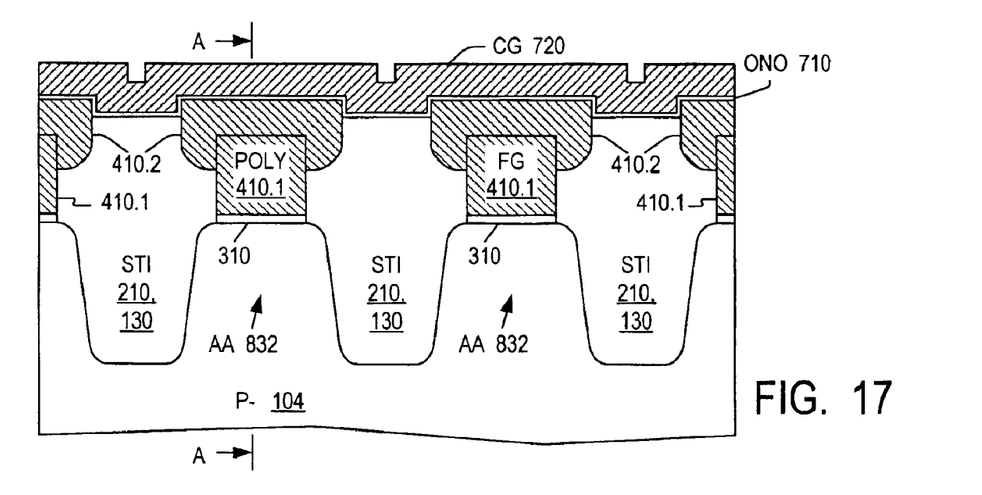

An optional etch of oxide 210 lowers the top surface of oxide 210 to a level below the top surface of polysilicon 410.2 (FIG. 16) to increase the capacitive coupling between the floating gates 410.1, 410.2 and the control gates 720 (FIG. 17). See the aforementioned U.S. Pat. No. 6,355,524.

Insulating layer 710 (FIG. 17) is formed over the structure. In some embodiments, layer 710 is a sandwich of silicon dioxide, silicon nitride, silicon dioxide (ONO). A conductive layer 720, e.g. doped polysilicon, is deposited over ONO 710. Layer 720 provides the control gates. Layers 720, 710, 410.1, 410.2 can be patterned as desired.

Figure 18:
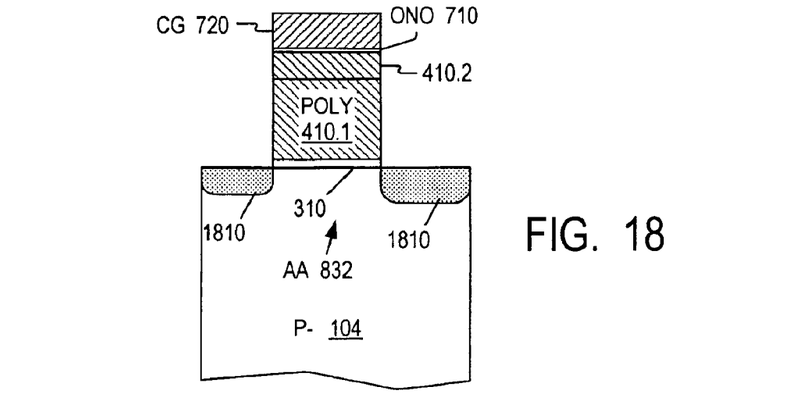
Figure 19:
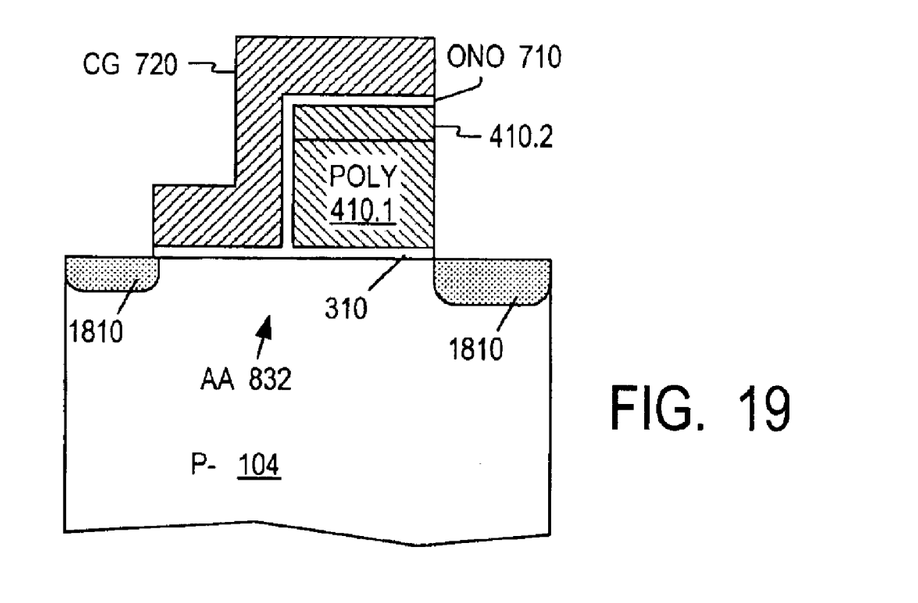
Figure 20:
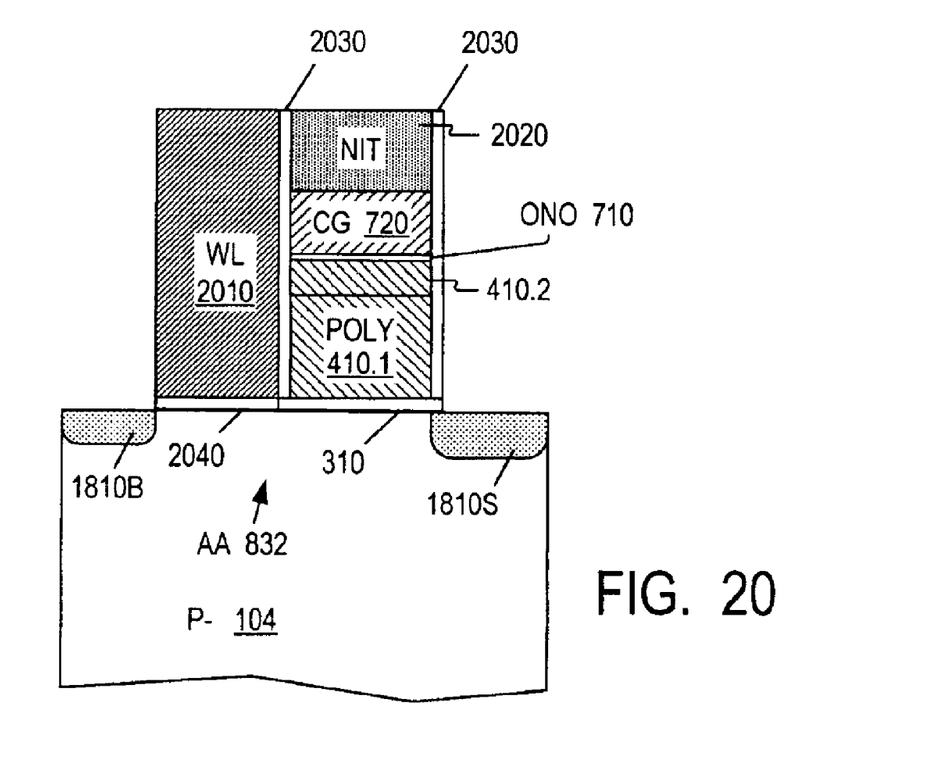

Other fabrication steps, such as doping of the source and drain regions, depend on a particular memory structure. The floating gate fabrication techniques described above can be incorporated into many memory structures, known or to be invented. Some structures are shown in FIGS. 18–20. These figures illustrate the memory cross-sections by a vertical plane marked A—A in FIG. 17. This plane passes through an active area 832, and is perpendicular to the cross-sectional plane of FIGS. 8–17. The memory cell source/drain regions are shown at 1810. FIG. 18 illustrates a stacked gate memory cell, with each control gate line 720 overlying a number of floating gates made from layers 410.1, 410.2. See U.S. Pat. No. 6,013,551 issued Jan. 11, 2000 to Chen et al., incorporated herein by reference. FIG. 19 illustrates a split gate cell, in which the layer 720 provides a control gate and a select gate.

Figure 21:
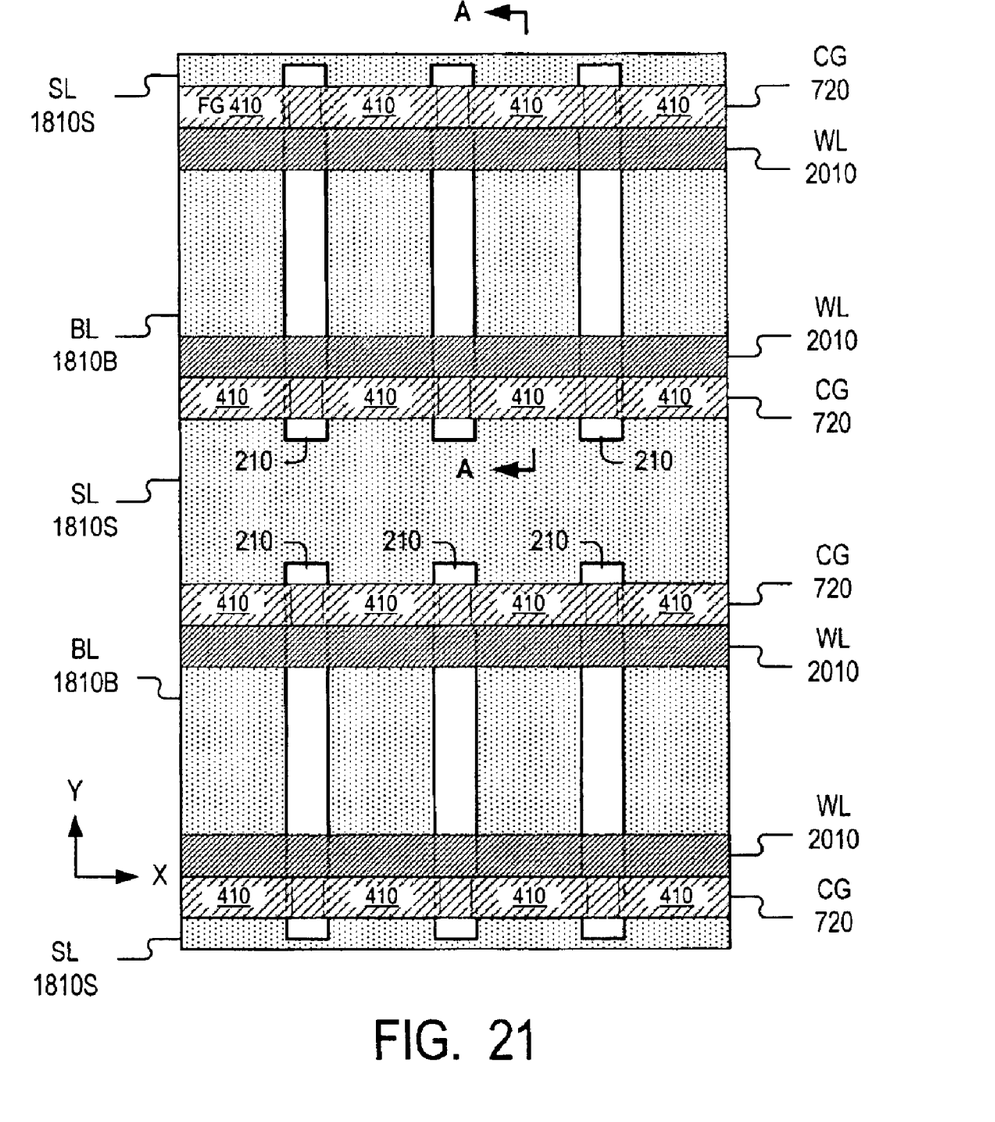
FIG. 21 is a top view of the structure of FIG. 20.

FIG. 20 illustrates a cell in which the select gate is provided by a separate conductive layer 2010. This type of cell is described in the aforementioned U.S. Pat. No. 6,355,524. The top view of the memory array is shown in FIG. 21. Line A—A in FIG. 21 marks the cross sectional plane of FIG. 20 (the same plane as marked in FIG. 17). The floating gates 410.1, 410.2 are shown at 410 in FIG. 21. The source/drain regions are shown as 1810S (source line) and 1810B (bit line regions connected to bitlines; the bitlines are not shown). After the deposition of polysilicon 720, a silicon nitride layer 2020 (FIG. 20) is formed on the structure. (Nitride 2020 is not shown in FIG. 21.) Then the layers 2020, 720, 710, 410.2, 410.2 are patterned using a single photolithographic mask. As a result, the layer 720 forms a number of control gate lines extending in the row direction (X direction in FIG. 21) across the memory array. Each control gate line provides the control gates for one row of the memory cells. Dielectric 2030 is formed over the sidewalls of each structure containing the layers 2020, 720, 710, 410.2, 410.1 for one row. The exposed portions of oxide 310 are etched away, and gate dielectric 2040 is formed on the exposed substrate areas for the select transistors. Doped polysilicon 2010 is deposited and patterned to form wordlines. Each wordline provides the select gates for one row.

The etch of polysilicon 410.1 and oxide 310 exposes the trench dielectric 210 and possibly the silicon substrate 104. As shown in FIG. 17, dielectric 210 overlaps the edges of active areas 832 and protects the active areas from pitting during the etch of layers 410.1 and 310. Also, the overlapping portions of dielectric 210 prevent the trench dielectric grooving at the trench edges. (The grooving, i.e. removal of the trench dielectric at the trench edges, may increases the leakage current in the active areas near the trenches.) At the same time, the top surface of dielectric 210 is recessed and in some embodiments does not overlap the active areas, providing the increased capacitance between the floating and control gates.

In another embodiment, gate oxide 310 and polysilicon 410.1 are formed before the etch of trenches 130. Then a sacrificial silicon nitride layer is deposited. The nitride layer, the layers 310, 410.1, and substrate 104 are patterned with a single mask to form the trenches. See the aforementioned U.S. Pat. No. 6,355,524. The trenches are filled with dielectric 210. The sacrificial nitride is removed. Dielectric 210 protrudes upward above the polysilicon 410.1, as in FIG. 12. The fabrication proceeds as in FIGS. 13–17.

The invention is not limited to the structures and methods described above. The invention is not limited to any materials or fabrication processes. For example, floating gate layers 410.1, 410.2 can be formed from different materials. The top surface of layer 410.2 (FIG. 17) could be even with, or below, the top surface of layer 410.1. The invention is not limited to any memory programming or erase mechanisms. The invention includes both flash and non-flash memories. Other embodiments and variations are within the scope of the invention, as defined by the appended claims.

What is clamed is:

1. A method for manufacturing an integrated circuit, the method comprising:
    (1) obtaining a structure comprising:
        a semiconductor substrate having a plurality of first areas which are to include one or more active areas of one or more nonvolatile memory cells;
        one or more dielectric regions for providing isolation between at least two of the first areas, each dielectric region having a portion below the top surface of the substrate, the dielectric regions rising above the substrate, each dielectric region having a sidewall abutting at least one of the first areas, wherein at least a top portion of the sidewall is exposed;
        a first conductive layer over the one or more first areas, the first conductive layer being insulated from the one or more first areas, the first conductive layer providing a first portion of a conductive floating gate for each nonvolatile memory cell;
    (2) removing material from at least the top exposed portion of each sidewall of each said dielectric region, to recess the top portion of the sidewall laterally away from the adjacent first portion of the floating gate;
    (3) forming a second conductive layer over the one or more first areas, the second conductive layer contacting the first conductive layer and providing a second portion of the floating gate for each nonvolatile memory cell, the second conductive layer abutting the top recessed sidewall portions of said dielectric regions.

2. The method of claim 1 further comprising:
    forming a dielectric layer over the first and second conductive layers;
    forming a third conductive layer on the dielectric layer, to provide a control gate for each nonvolatile memory cell.

3. The method of claim 1 wherein the dielectric region has a portion overlapping at least one of the first areas, but a top portion of the dielectric region does not overlap the first areas.

4. The method of claim 3 wherein the top portion of the dielectric region is laterally offset from the first areas.

5. The method of claim 3 further comprising:
    forming a dielectric layer over the first and second conductive layers;
    forming a third conductive layer on the dielectric layer, to provide a control gate for each nonvolatile memory cell;
    etching the third conductive layer and the first conductive layer to pattern the floating gates and the control gates.

6. The method of claim 1 wherein the first conductive layer is formed after the dielectric regions.

7. The method of claim 1 wherein the first conductive layer is before the dielectric regions.

8. The method of claim 1 wherein the operation (1) comprises forming one or more trenches in the semiconductor substrate, wherein in said dielectric regions, said portions below the top surface of the substrate are located in the one or more trenches.

9. The method of claim 8 further comprising etching the substrate to form the trench for each dielectric region.

10. The method of claim 1 wherein the operation (2) comprises isotropic etching of the dielectric regions.

11. The method of claim 1 wherein in said structure obtained in the operation (1), the top surfaces of the dielectric regions are higher than the top surface of the first layer.

12. The method of claim 1 wherein at a conclusion of the operation (2), the top surfaces of the dielectric regions are higher than the top surface of the first layer.

13. The method of claim 1 wherein at each floating gate, the top portion of the second layer is not higher than the top portion of each dielectric region adjacent to the floating gate.

* * * * *